United States Patent [19]
Bailey et al.

[11] Patent Number: 5,262,691
[45] Date of Patent: Nov. 16, 1993

[54] GATE TURNOFF THYRISTOR CONTROL CIRCUIT WITH SHORTED GATE DETECTION

[75] Inventors: Ronald B. Bailey; Herbert J. Brown, both of Erie, Pa.

[73] Assignee: General Electric Company, Erie, Pa.

[21] Appl. No.: 983,498

[22] Filed: Nov. 30, 1992

Related U.S. Application Data

[63] Continuation of Ser. No. 584,541, Sep. 18, 1990, abandoned.

[51] Int. Cl.$^5$ .................... H03K 17/72; H03K 17/08
[52] U.S. Cl. .................... 307/633; 361/93; 361/58; 363/54; 363/57
[58] Field of Search .......... 307/633, 638, 642, 639; 361/93, 94, 98, 101, 58, 100; 363/54, 57

[56] References Cited

U.S. PATENT DOCUMENTS 4,597,038  6/1986  Stacey ........................ 307/633

FOREIGN PATENT DOCUMENTS

| 3619740 | 12/1987 | Fed. Rep. of Germany | 307/633 |
| 0030237 | 3/1980 | Japan | 307/633 |
| 0162964 | 10/1982 | Japan | 307/633 |
| 0093463 | 6/1983 | Japan | 307/633 |

*Primary Examiner*—John Zazworsky
*Attorney, Agent, or Firm*—R. Thomas Payne

[57] ABSTRACT

For responding to a shorted gate in a gate turnoff thyristor the gate electrode of which is connected by means of a controllable switch to a control voltage terminal having a negative potential with respect to the cathode potential of the thyristor, the controllable switch being arranged to conduct negative gate current in response to a thyristor turnoff command, voltage comparing means is coupled to the controllable switch for detecting when the switch is conducting negative gate current of relatively high magnitude, timing means is active for a predetermined interval following the start of said thyristor turnoff command, and logic means is operative to cause the switch to stop conducting negative gate current if the voltage comparing means detects high gate current at the end of such interval.

14 Claims, 1 Drawing Sheet

GATE TURNOFF THYRISTOR CONTROL CIRCUIT WITH SHORTED GATE DETECTION

This application is a continuation of application Ser. No. 07/584,541, filed Sep. 18, 1990, now abandoned.

BACKGROUND OF THE INVENTION

This invention relates generally to the control of a high-speed, solid-state, unidirectional electric valve of the kind that will switch from a non-conducting (off) state to a conducting state (on) in response to a relatively positive control voltage being applied to a gate electrode of the valve and that will subsequently turn off in response to a negative control voltage being alternatively applied to the same gate, and it relates more particularly to means for detecting and responding to a malfunctioning valve that fails to turn off when negative control voltage is applied to its gate.

A valve of the kind described is known generally as a gate turnoff (GTO) thyristor. It is a multi-layer semiconductor designed to freely conduct "forward" anode current (i.e., current flowing into its anode and out of its cathode) when its gate electrode is triggered by a suitable turn-on or firing signal. A GTO thyristor is distinguished from a conventional thyristor by its ability to interrupt or block forward anode current if a voltage of relatively negative polarity and appropriate magnitude and duration is applied across its gate-cathode junction. Such voltage is negative in the sense that the electrical potential of the gate is negative with respect to the cathode. It causes current to flow in a reverse direction in the thyristor's gate. In other words, to turn off a GTO thyristor current is drained from the gate. Hereinafter such current is referred to as either "negative gate current" or the "turnoff signal."

In normal operation, the anode current-blocking or turnoff process of a GTO thyristor can be initiated at any time without waiting for a natural or externally forced zero crossing of the anode current. During the turnoff process the negative gate current rapidly rises to a high peak that depends on the magnitude of anode current to be interrupted and then subsides as the thyristor recovers its ability to withstand off-state anode voltage. Once a turnoff process is successfully completed, the resistance of the gate-cathode junction is very high and limits negative gate current to a trivial magnitude.

Occasionally a GTO thyristor malfunctions, failing to turn off after the turnoff signal is applied to its gate. Typically the failure mode is an internal short circuit between the anode and the cathode of the thyristor, and this normally results in a shorted gate. Means for detecting such a failure would be useful for both diagnostic and protective purposes. When a shorted gate occurs, the gate-cathode resistance of the thyristor remains low and will not limit gate current effectively. Under this abnormal condition an undesirably high magnitude of negative gate current would continue to flow so long as the negative control voltage is applied to the gate, and the large amount of energy drained from the failed GTO thyristor could seriously overheat or otherwise damage the associated control circuit.

SUMMARY OF THE INVENTION

A general objective of the present invention is to provide improved means responsive to a failed GTO thyristor for protecting the control circuit that provides the turnoff signal for the GTO thyristor.

Another objective is to provide, in a GTO thyristor control circuit, improved means for detecting a shorted gate of the thyristor.

Yet another objective of the invention is the provision of an improved method to protect the control circuit from a shorted gate.

In carrying out the invention in one form, a high-speed, solid-state gate turnoff electric valve is connected between a source of electrical power and an electric load circuit. This valve has alternative on and off states. In its on state the valve has negligible resistance and freely conducts load current, whereas in the off state it has a resistance of very high ohmic value that resembles an open circuit and effectively decouples the power source from the load circuit. Control means is coupled to the gate of the valve for providing alternative turn on and turnoff signals thereto. The turnoff signal is provided by means of a controllable switch connected between the gate and a control voltage terminal having a negative potential with respect to the cathode potential of the valve. In normal operation the controllable switch is caused to conduct "negative" gate current from the thyristor gate to the control voltage terminal in response to a valve turnoff command and to not conduct such current in response to a valve turn on command.

In one aspect of the invention, the valve control means includes first means coupled to the aforesaid controllable switch and having alternative first and second output states, the first output state being true if negative gate current being conducted by the switch exceeds a predetermined threshold magnitude that is less than the lowest peak magnitude needed to turn off the valve but greater than the magnitude normally conducted after the valve is in its off state, and the second output state being true otherwise. Second means associated with the control means is operative to cause the switch to stop conducting negative gate current in response to the first output state of said first means being true, and third means is provided for delaying operation of the second means until the end of a predetermined interval following the start of the aforesaid valve turnoff command, thereby ensuring that the switch continuously conducts negative gate current throughout such interval. By the end of this interval, the first means would be in its first state with a false output if the valve turnoff process were normal but would be in its first state with a true output if the valve has a shorted gate. In the latter event, the second means is operative to protect the valve control means by terminating the conducting state of the controllable switch. Preferably, the control means also includes fourth means responsive to operation of the second means for ensuring that the second means remains operative for at least a predetermined "latch-in" period regardless of the output level of the first means during this period.

In other aspects of the invention, the first means comprises voltage comparing means the first output state of which is true only when the voltage across the controllable switch exceeds a predetermined magnitude that is attained whenever the magnitude of negative gate current equals the aforesaid threshold magnitude, and logic means is provided for indicating the coexistence of a valve turnoff command and the first state of said first means.

The invention will be better understood and its many objectives and advantages will be more fully appreciated from the following description taken in conjunction with the accompanying drawings.

DETAILED DESCRIPTION OF THE INVENTION

Figure 1:
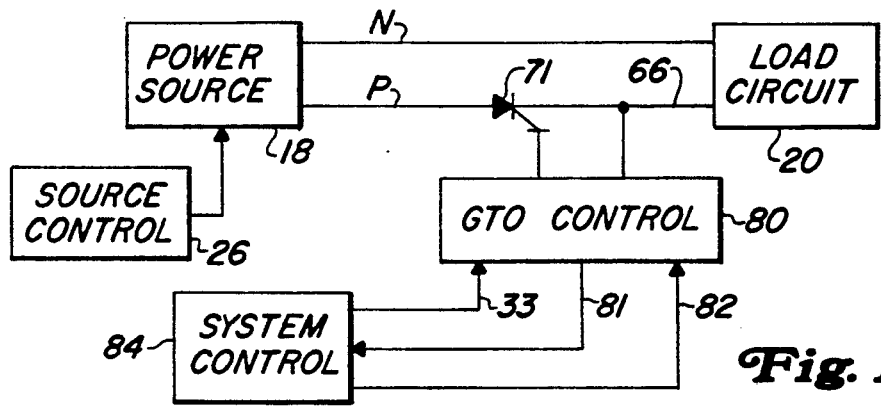
FIG. 1 is a block diagram of a typical electrical power system including a GTO thyristor.

The system shown in FIG. 1 includes a source 18 of electric power, an electric load circuit 20, and means for interconnecting the source 18 and load 20. The latter means comprises a first conductor N connected directly between an output terminal of the source 18 and one end of the load 20, a second conductor P connected to another output terminal of the source 18, a third conductor 66 connected to the other end of the load 20, and a high-speed, solid-state controllable electric valve 71 connected between conductors P and 66. In the illustrated application of the invention, the power source 18 supplies direct current to the load circuit, and suitable control means 26 is associated therewith for the purpose of varying the magnitude of voltage between the output conductors P and N as desired. In other practical applications of the invention, the output voltage of the source is either a unipolarity voltage of relatively constant magnitude or an alternating voltage of relatively constant amplitude.

The electric valve 71 is known generally as a gate turnoff thyristor or GTO device. It is poled to conduct load current in one direction only, i.e., from conductor P to conductor 66. Although not shown in FIG. 1, in practice an inversely poled solid-state diode and a suitable snubber circuit are usually connected in parallel circuit relationship with the valve 71. Voltage limiting means (not shown) is connected across the load circuit 20 if needed.

The GTO device 71 will conduct forward load current (i.e., current flowing into its anode and out of its cathode) when its gate electrode is triggered by a suitable turn-on or firing signal and will effectively block such current after a turn-off signal is alternatively applied to the same gate. In one application of the invention, this device is rated to conduct steady state unidirectional load current of 450 amperes when turned on and to withstand a forward voltage in excess of 1,600 volts when turned off, such device being capable of successfully turning off current as high as 1,200 amperes in response to a turnoff signal of suitable magnitude.

Whenever the GTO device or valve 71 is in a turned on state, it presents negligble resistance to forward load current, and such current can freely flow from output conductor P of the electric power source 18 through the conductor 66 and the load circuit 20 to conductor N. But in its turned off state the valve resistance has such a high ohmic value as to block or interrupt any load current. To change the GTO valve 71 between these two alternative states, control means 80, labeled "GTO Control," is associated therewith. The control means 80 is operative in response to receipt of a discrete signal on a line 33 to change the GTO valve 71 from on to off states and at the same time to change a normally high "status" signal on an output line 81 to a low state. The control means 80 is also operative in response to receipt of another discrete signal on a separate input line 82 to change the GTO valve 71 from off to on states. The lines 33 and 82 originate in suitable system control means 84.

In the illustrated application of the invention, the system control means 84 is arranged to produce a signal on the line 82 that normally maintains the valve 71 in its turned on state (which signal is hereinafter referred to as the "enable" signal) and alternatively, if and when a certain malfunction is detected, to produce a "fault" signal on the line 33 that causes the valve 71 immediately to turn off. Status on line 81 would be returned low and the system control 84 would remove the enable signal line 82 in normal operation. After the malfunction is cured, the enable signal is restored. The presently preferred manner in which this is accomplished is disclosed and claimed in copending U.S. patent application Ser. No. 07/584,566 filed concurrently herewith for R. B. Bailey et al and assigned to General Electric Company, which disclosure is expressly incorporated herein by reference. In a different application of the invention, the GTO valve 71 is one of a plurality of interconnected valves that are repetitively turned on and off in a well known manner to form the power section of a polyphase electric power inverter, in which case the system control means 84 would be arranged to produce a first train of periodic, discrete signals on the line 82 and another train of periodic, discrete signals on the line 33, the latter signals being staggered with respect to the signals in the first train and the timing of each train being controlled as desired.

The turn off process of the GTO valve 71 actually has three stages. Once a GTO turnoff signal is applied to the gate of this valve, there is a brief delay (known as the "storage" time) before forward load current begins to decrease. Then, during a very short interval known as the "fall" time, current decreases rapidly to a very low magnitude. The turnoff time of valve 71 (e.g., approximately 15 microseconds) is the sum of the storage and fall times. However, the turnoff signal must not be removed before the end of a longer interval (known as the "tail" time) which is required for the valve to recover fully its ability to withstand off-state voltage without prematurely reverting to a turned on state. During the latter interval the valve will continue to conduct a relatively small amount of forward load current (known as "tail" current) as its resistance increases and the voltage across it rises. At the conclusion of this process, there is no load current in the GTO valve 71, the off-state voltage applied to the main electrodes of this valve is the same as the voltage across the output conductors P,N of the power source 18, and the source 18 is effectively decoupled from the load circuit 20.

Figure 2:
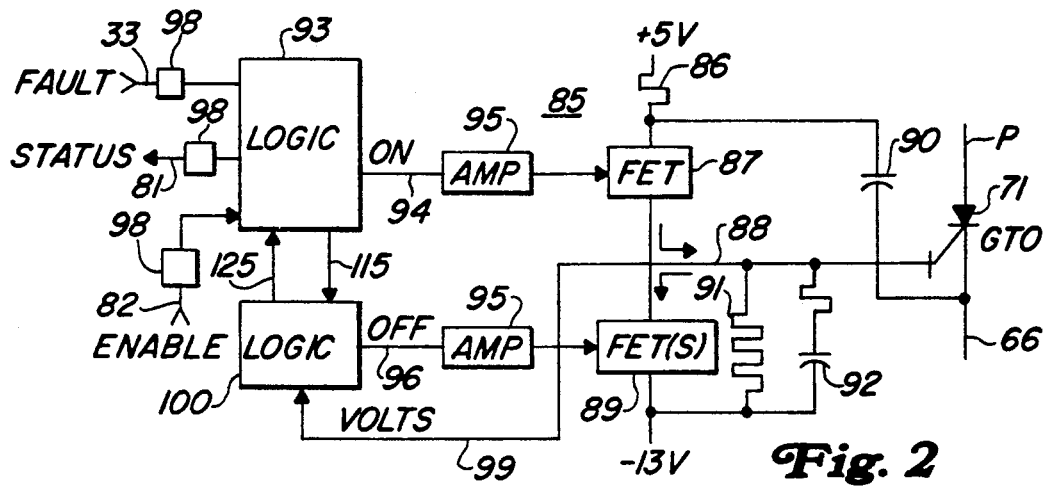
FIG. 2 is an expanded block diagram of the GTO control means shown as a single block in FIG. 1.

As previously described, the GTO valve 71 is changed between its on and off states by the control means 80 in response to the fault signal on line 33 and the enable signal on line 82. The presently preferred embodiment of the control means 80 is illustrated in FIG. 2 which will now be described. It comprises suitable gating means 85 for supplying the gate electrode of the valve 71 with either a positive current that effects turn-on of this device, or a relatively negative current that effects turn-off of the same device. FIG. 2 includes a simplified schematic diagram of gating means used in the flashover protection system that is disclosed in the previously referenced copending patent application Ser. No. 07/584,566. To supply the turn-on signal, a suitable source of positive potential of approximately 5 volts with respect to the cathode potential of valve 71 is connected to the gate of the GTO valve 71 through a resistor 86 of low ohmic value (e.g., 0.5 ohm), a first controllable solid-state switch 87, and a line 88. Preferably the switch 87 is a conventional power field effect transistor (FET). A capacitor 90 is connected between the high side of this switch and the cathode of the GTO valve 71. When the state of the first switch 87 is changed from non-conducting to conducting, the +5 volts turn-on signal source is immediately applied to the GTO gate electrode. Preferably this source includes electric energy storing means (e.g., a capacitor of relatively high capacitance value pre-charged to a higher level of voltage, for example 13 volts) that rapidly discharges when the switch 87 starts conducting so that an initial pulse of turn-on energy is supplied to the gate-cathode junction of GTO 71, after which the switch 87 continues conducting the required holding current from the +5 volts source.

To supply the turnoff signal for the GTO valve 71, its gate is connected to a control voltage terminal having a negative potential of approximately 13 volts with respect to the GTO cathode through the line 88 and a second controllable solid-state switch 89 which preferably comprises a parallel array of three FETs arranged to turn on and off in unison. The second switch 89 is shunted by a bias resistor 91 and also by a circuit comprising another resistor in series with a capacitor 92. When the second switch 89 changes to its conducting (turned-on) state, the resistance of the drain-source path in each of the three parallel FETs that form this switch is abruptly changed from a high ohmic value to a low ohmic value, and consequently the resistance between the main terminals of the switch 89 decreases to a very low value (e.g., approximately 0.007 ohm). This allows the capacitor 92 to discharge through the switch 89, thereby reversing the direction of current in the line 88. Current in the gate-cathode junction of the GTO valve will change rapidly (e.g., approximately 40 amps per microsecond) from its positive holding current magnitude (e.g., +6 amperes) to a peak negative magnitude (e.g., approximately 100 amperes or more, depending on the magnitude of load current) needed to restore the valve's ability to block forward load current. As the GTO valve is turning off, the resistance of its gate-cathode junction increases and the negative gate current subsides from the aforesaid peak magnitude to a trivial magnitude. Negative current subsides at a slower rate than it rises (e.g., approximately 25 amps per microsecond). Once the valve turns off and the tail time expires, it will remain off until another turn-on signal is applied to its gate. The gate potential of the GTO valve is slightly above cathode potential when this device is on, and is nearly the same as the potential of the −13 volts terminal when the valve 71 is off and the second switch 89 is turned on.

The conducting states of the two switches 87 and 89 are selectively controlled by associated logic means 93 and 100 so that only one switch is conducting (turned on) at any time. An output line 94 of the first logic means 93 is coupled through an amplifier 95 to the control terminal of the first switch 87, and an output line 96 of the second logic means 100 is coupled through a duplicate amplifier 95 to the control terminal of the second switch 89. The first logic means 93 is supplied with both the fault signal on the line 33 and the enable signal on line 82, the lines 33 and 82 being respectively connected to two different inputs of this logic means through suitable optical couplers 98. A second output line of the first logic means 93 is optically coupled to the line 81 on which the status signal is provided. The second logic means 100 has two inputs: one is connected to a third output line 115 of the first logic means 93; the other is coupled to the second switch 89 via a line 99 which supplies it with a feedback value that is a measure of the voltage magnitude across the switch 89.

The logic means 93 is so constructed and arranged that the signal produced on its first output line 94 has a high or "ON" state so long as an enable signal is present on the line 82 but will change from high to low states in response to a fault signal being received on the line 33. Concurrently with the latter event, the logic means 93 changes the signal on its second output line from high to low, thereby effecting a corresponding change of the status signal that the GTO control means 80 provides on line 81. An "off-pulse" timer in the logic means 93 will prevent the first output signal on the line 94, after changing from high to low states, from resuming its high state for a predetermined delay period (e.g., approximately one second). This timer also enables a high status signal to return on line 81 upon expiration of such delay period. On its thrid output line 115 the first logic means 93 produces an input signal for the second logic means 100, the state of this input signal being opposite to the state of the first output signal on line 94; that is, the input signal on line 115 is low whenever the first output signal is high and is high whenever the first output signal is low. Circuit details of the presently preferred embodiment of the first logic means 93 are more fully disclosed in the previously referenced copending patent application Ser. No. 07/584,566.

Each low-to-high transition of the first output signal on line 94 will cause the first switch 87 to conduct, thereby changing the controllable GTO valve 71 to its turned-on state. Alternatively, a low signal on the line 94 will bias the first switch 87 to its non-conducting state. Thus a high output signal on line 94 functions as a valve turn on command. In a manner that will soon be explained, the second logic means 100 responds to the input signal on the line 115 by normally producing a signal on its output line 96 that has a high or "OFF" state so long as the input signal is high but has a low state otherwise. Each low-to-high transition of the output signal on line 96 will case the second switch 89 to conduct, thereby changing the GTO valve 71 to its turned-off state. Alternatively, while the input signal is low the signal on the line 96 is low so as to bias the second switch 89 to its non-conducting state, which will be true whenever the signal on the output line 94 of the first logic means 93 is in its ON state. Thus a high input signal on line 115 functions as a valve turnoff command.

Figure 3:
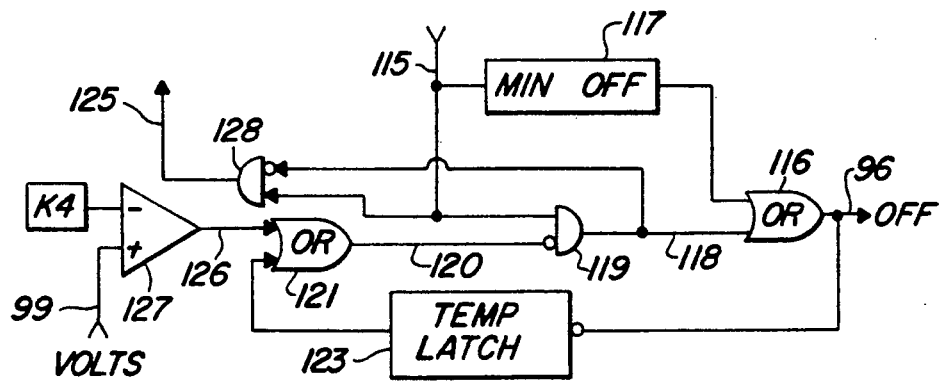
FIG. 3 is a functional block diagram of the logic means used in the GTO control means to implement the present invention.

The presently preferred embodiment of the logic means 100 is shown in FIG. 3 and will now be described. It employs several dual input analog logic circuits suitably interconnected and arranged to perform the various functions described below. For the sake of convenience, the individual logic circuits have been shown symbolically in a somewhat simplified form in FIG. 3 and are hereinafter called "units." One type of unit has a high ("1") output state only when its first input is high and its other input is low "0"), the latter input being referred to as a "not" input. In practice, this same function could be performed by other equivalent logic circuits, such as the combination of a conventional AND logic circuit with a polarity inverter ahead of its second input, or the combination of a conventional NOR logic circuit with a polarity inverter ahead of its first input.

In accordance with the present invention, the input line 115 of the logic means 100 is connected to the output line 96 by means of an OR logic unit 116 having two inputs, one input being connected through a timer 117 (labeled "min off") to the line 115 and the other input being connected via a line 118 to the output of another unit 119 the first input of which is connected to the line 115 and the not input of which is connected to a line 120 on which a high signal is provided when the GTO valve is on but not when the GTO valve is off under normal conditions. The timer 117 is a conventional "one-shot" time delay circuit, the first output of which is normally low but will change to a temporary high state as soon as the signal applied to the input of the circuit changes from low to high, will then remain high for a fixed interval of time even if the input signal changes sooner from high to low, and will automatically return to its normal low state at the end of such interval even if the input signal remains high. So long as the signal on output line 94 of the first logic means 93 (FIG. 2) is high, the input signal on line 115 is low and therefore the output state of the OR logic unit 116 is low. But whenever a high signal is applied to the line 33, the signal on output line 94 changes state from high to low, the input signal on line 115 goes high, and the status signal on line 81 changes from high to low. The system control means 84 (FIG. 1) will respond to this status change by immediately changing the enable signal on line 82 from high to low states and later restoring the high state of this signal. The min-off timer 117 in FIG. 3 responds to the low-to-high transition of the input signal on line 115 by temporarily supplying a high signal to the OR unit 116 which consequently produces a high signal on the output line 96 (i.e., the aforesaid OFF state for turning off the GTO valve 71). Once produced in this manner, the high signal on line 96 will remain high for a desired minimum interval measured from the moment of time when the signal on line 115 changed from low to high states. The timer 117 is suitably adjusted to ensure that the duration of any turnoff signal applied to the gate of the valve 71 will equal or exceed the sum of the aforesaid turnoff and tail times of this valve.

Throughout the interval that the enable signal on line 82 is low, the signal on output line 94 of the first logic means 93 (FIG. 2) is low, no GTO turn-on signal can be produced by the control means 80, and the OFF state of the signal on the output line 96 of the logic means 100 is sustained (assuming there is no high signal on the line 120). But as soon as the high state of the enable signal is restored and the aforesaid off-pulse delay period expires, the logic means 93 returns the signal on line 115 to a low state, the signal on output line 96 changes states from high to low thereby terminating the GTO turnoff signal, and concurrently the signal on output line 94 changes from low to high thereby causing the GTO gating means 85 to apply a turn-on signal to the gate of the GTO valve 71. Persons skilled in the art will appreciate the advantages of sustaining the OFF state of the signal on the output line 96 until a valve turn on command is received. Briefly stated, the OFF state on line 96 keeps the turnoff switch 89 in a conducting state which continuously clamps the gate of the GTO valve 71 to the −13 volts control voltage terminal, thereby preventing undesired "avalanche" firing of the turned off valve if the anode-to-cathode path becomes forward biased by a high or rapidly rising voltage.

In the event the GTO valve 71 has a shorted gate, this device will fail to turn off when a turnoff signal is applied to its gate. In accordance with the present invention, the logic means 100 includes means for detecting this abnormal event and for protecting the GTO control means 80 from resulting damage. As is illustrated in FIG. 3, it comprises the min-off timer 117, the logic unit 119, an OR logic unit 121, another timer 123 (labeled "temp latch"), and suitable means 127 for comparing the feedback value on line 99 (i.e., the actual volts across the turnoff switch 89 in FIG. 2) with a predetermined, relatively small reference magnitude K4 (e.g., approximately 0.7 volt). K4 is selected to be equal to the voltage developed across the turnoff switch 89 whenever this switch is in its conducting state and negative current in the gate of the GTO valve 71 equals a certain high threshold magnitude that is normally experienced only during the turnoff and tail times of a successful turn off process of this valve, and it is much less than the volts across the switch 89 when biased to its non-conducting state. This threshold magnitude of gate current (e.g., approximately 100 amps) is selected to be greater than the magnitude conducted by the switch 89 when the valve 71 is turned off and preferably less than the lowest peak magnitude needed to change the valve from on to off states. The comparing means 127 has a high output state so long as the feedback value on line 99 referenced to the −13 volts is greater than K4, which is true if either the turnoff switch 89 is turned on and conducting high current or both the turnoff switch and the GTO valve are turned off but is not true if the turnoff switch 89 is turned on and not conducting appreciable current. In the latter event, the comparing means output has a low state.

The output of the comparing means 127 is connected by means of a line 126 to one input of the OR unit 121. The temp-latch timer 123, which has a normally low output, is connected between the output line 96 of the logic means 100 and the second input of the unit 121. The timer 123 is similar to the min-off timer 117 but is activated by a high-to-low transition of the output signal on line 96. Once activated, the timer 123 will supply a high signal to the second input of the OR unit 121 for a predetermined relatively short "latch-in" period of time (e.g., approximately 30 microseconds). Thus the output of the unit 121 is in a high state during the temporary latch-in period after the OFF state of the signal on the output line 96 terminates or whenever the comparing means 127 has a high output state, and otherwise it is low. The output state of unit 121 is conveyed by the line 120 to the not input of the logic unit 119. So long as this input is low, the output of the latter unit (i.e., the signal on line 118) will track the high and low states of the signal on the line 115; otherwise the signal on line 118 is low.

In operation, the signal on line 115 changes from low to high in response to a high fault signal being supplied to the logic means 93 or normal turnoff when the enable signal is removed, which event marks the start of a GTO valve turnoff command. At the same time the output of the min-off timer 117 changes from its normal low state to a high state which subsists until the end of the aforementioned minimum interval. This temporary high output is coupled by the OR logic unit 116 to the output line 96 of the logic means 100, thereby turning on the turnoff switch 89 which conducts the negative gate current required to turn off the GTO valve 71 as previously described. When the switch 89 initially turns on, the voltage across it collapses to a negligible magnitude and the signal on the output line 126 of the comparing means 127 changes from high to low. Concurrently, the output of the OR unit 121 changes from high to low, and the unit 119 causes the signal on line 118 to change from low to high. Thereafter the negative GTO gate current in the switch 89 rapidly increases and soon exceeds the threshold magnitude at which the voltage feedback value on line 99 with respect to −13 equals K4 with respect to −13 volts, whereupon the signals on lines 126 and 120 respectively return to their former high states and the signal on line 118 temporarily returns to its former low state.

During a normal GTO turnoff process, negative gate turnoff current subsides from a high peak value to a trivial magnitude, and the volts across the turnoff switch 89 will decrease to less than K4 before the end of the tail time of the valve 71. As such voltage decreases below K4, the signals on lines 126 and 120 again change to the their low states and the unit 119 concurrently changes the signal on line 118 to its high state. The latter signal is coupled by the OR unit 116 to the output line 96, thereby sustaining the OFF state of the output signal on this line after the output of the min-off timer 117 automatically reverts to its low state at the end of the minimum interval. Throughout this normal turnoff process, the output of the templatch timer 123 will be low.

However, if the gate of the GTO valve 71 were shorted, negative gate current would not subside during the attempted turn-off process. In this event, the volts across the switch 89 would not decrease below K4, the signals on both lines 126 and 120 would remain high, unit 119 would keep the signal on its output line 118 low, and the output signal on line 96 would return to a low state as soon as the output of the min-off timer 117 returns to its normal, low state at the end of the minimum turnoff interval. The resulting low signal on the output line 96 of the logic means 100 will bias the switch 89 to its off state, thereby removing the low-resistance path that this switch would otherwise provide, if it were not turned off, from the gate of the GTO valve to the −13 volts control voltage terminal (see FIG. 2) and causing the switch to stop conducting negative gate current. Interrupting negative current in the shorted gate of the valve 71 will protect the switch 89 from damage caused by continuing to conduct high current after the minimum turnoff interval expires. To ensure proper operation of the shorted gate detector in the illustrated embodiment of the invention, the minimum turnoff interval is approximately 80 microseconds. In effect, the min-off timer 117 delays the protective operation of the logic unit 119 until the end of the minimum turnoff interval following the start of the aforesaid valve turnoff command, thereby preventing a false response to the temporarily low signal on the line 118 during a normal GTO turnoff process and ensuring that the logic means 100 continues to apply a high signal via its output line 96 to the turnoff switch 89 throughout the minimum turnoff interval.

As soon as the output signal on line 96 changes from high to low in delayed response to the volts across the turnoff switch 89 increasing above K4 (which in turn caused the high-to-low transition of the signal on the output line 118 of the unit 119 as described above), the output of the templatch timer 123 changes from low to high this same result occurs during normal removal of the off signal in a non-fault condition but is of no consequence to the present invention. This ensures that the high signal on line 120 remains high and the low signal on line 118 remains low during the ensuing latch-in period, regardless of whether the signal on line 126 is high or low. Thus the temp-latch timer 123 inhibits undesirable oscillation of the output signal on line 96 if the output state of the comparing means 127 were to change from high to low during such period. Such a change will occur when the turnoff signal applied to the valve 71 is terminated and the gate voltage relative to −13 volts supply "rings" negative below K4 due to oscillatory interaction of the snubber capacitance across the valve and the inherent inductance in the gate circuit.

The detection of a shorted gate also causes a low-to-high state change of an output signal on a line 125 interconnecting the logic means 93 and 100. As is shown in FIG. 3, the latter signal is provided by a logic unit 128 whose first input is connected to the line 115 and whose not input is connected to the line 118. The signal on line 118 would be low if a shorted GTO gate were detected while the signal on line 115 is high (i.e., while turnoff of the GTO valve is being commanded). In this event, the unit 128 is effective to provide a high output signal on line 125. The logic means 93 includes suitable means for maintaining a low status signal on the line 81 throughout the delay period provided by the previously mentioned off-pulse timer or whenever the signal on line 125 is high. It will be observed that during the previously described normal turnoff process of the GTO valve 71 the output of the comparing means 127 is high, due to the voltage feedback value on the line 99 temporarily rising above K4, for a short period of time during which the unit 128 will provide a high output signal on the line 125 even though there is no shorted gate. In some applications of the invention this temporary high signal on line 125 during a normal GTO turnoff process may provide a useful indication that such turnoff process is taking place.

While only one embodiment of the invention has been shown and described by way of example, many modifications will undoubtedly occur to persons skilled in the art. The concluding claims are therefore intended to cover all such modifications that fall within the true spirit and scope of the invention.

We claim:

1. A system for responding to a shorted gate in a gate turnoff thyristor to which alternative turn on and turn-off signals are applied, the turnoff signal being supplied by means of a controllable switch connected between the gate electrode of the thyristor and a control voltage terminal having a negative potential with respect to the cathode potential of the thyristor, the controllable switch having a control terminal coupled to control means that in normal operation causes the switch to conduct negative gate current from the thyristor gate to the control voltage terminal in response to a thyristor turnoff command and to not conduct such current in response to a thyristor turn on command, the control means comprising:

first means coupled to the controllable switch and having alternative first and second output states, the first output state being true if negative gate current being conducted by the switch exceeds a predetermined threshold magnitude that is less than a lowest peak magnitude needed to turn off the thyristor but greater than a magnitude normally conducted after the thyristor is turned off, the second output state being true otherwise;

second means, operatively connected to the control means, for causing the switch to stop conducting negative gate current in response to the first output state of the first means being true; and third means, operatively connected to the control means, for delaying operation of the second means until the end of a predetermined interval following the start of the thyristor turnoff command, thereby ensuring that the control means continues to cause the switch to conduct negative gate current throughout the interval.

2. The system of claim 1, wherein the controllable switch is a parallel array of field effect transistors arranged to operate in unison.

3. The system of claim 1, wherein the first means comprises:

voltage comparing means the first output state of which is true only when the voltage across the controllable switch exceeds a predetermined magnitude that is attained whenever the magnitude of negative gate current being conducted by the switch equals the threshold magnitude.

4. The system of claim 1 further comprising:

fourth means, responsive to operation of the second means, for ensuring that the second means remains operative for at least a predetermined period of time regardless of the output state of the first means during such period.

5. A system for responding to a shorted gate in a gate turnoff thyristor to which alternative turn on and turnoff signals are applied, the turnoff signal being supplied by means of a controllable switch connected between the gate electrode of the thyristor and a control voltage terminal having a negative potential with respect to the cathode potential of the thyristor, the controllable switch having a control terminal coupled to control means that in normal operation causes the switch to conduct negative gate current from the thyristor gate to the control voltage terminal in response to a thyristor turnoff command and to not conduct such current in response to a thyristor turn on command, the control means comprising:

first means coupled to the controllable switch and having alternative first and second output states, the first output state being true if the voltage across the switch exceeds a predetermined magnitude and the second output state being true otherwise, the predetermined magnitude being attained whenever the switch is conducting negative gate current of relatively high magnitude;

second means, operatively connected to the control means, for causing the switch to stop conducting negative gate current in response to the first output state of the first means being true; and third means also, operatively connected to the control means, for delaying operation of the second means until the end of a predetermined interval following the start of the thyristor turnoff command, thereby ensuring that the control means continues to cause the switch to conduct negative gate current throughout the interval.

6. A gate turnoff thyristor control circuit comprising:

a gate turnoff thyristor operatively connected between a source of electric power and an electrical load circuit and having alternative first and second states, in its first state the thyristor having negligible resistance in the path of load current and in its second state being effective to decouple the source from the load circuit;

control means for changing the thyristor from first to second states in response to a turnoff command being received by the control means and for returning the thyristor to its first state in response to an alternative turn on command being received (;), the control means including a controllable switch connected between the gate electrode of the thyristor and a control voltage terminal having a negative potential with respect to the cathode potential of the thyristor, during normal operation the controllable switch conducting negative gate current from the thyristor gate to the control voltage terminal in response to the turnoff command and not conducting such current in response to the turn on command;

comparing means coupled to the controllable switch and having alternative first and second output states, the first output state being true if the voltage across the switch exceeds a predetermined magnitude and the second output state being true otherwise, the predetermined magnitude being attained only when negative gate current being conducted by the switch has a threshold magnitude that is less than a lowest peak magnitude needed to turn off the thyristor but greater than a magnitude normally conducted when the thyristor is in its second state; and logic means coupled to the comparing means and effective only when the control means is receiving the turnoff command for indicating whether or not the first output state of the comparing means is true.

7. The control circuit of claim 6 further comprising;

timer means for ensuring that the controllable switch continues to conduct negative gate current during a predetermined interval of time following the start of the turnoff command, and means, operative at the end of the interval, for causing the switch to stop conducting negative gate current if the first output state of the comparing means is then true.

8. The control circuit of claim 7 further comprising:

, means responsive to operation of the causing means for ensuring that the causing means remains operative for at least a predetermined period of time regardless of the output state of the comparing means during such period.

9. A method for responding to a turn-off failure of a gate turnoff thyristor having an anode, a cathode, and a gate electrode, the gate electrode being connected by means of a controllable switch to a control voltage terminal having a negative potential with respect to the thyristor's cathode potential, comprising the steps of:

normally responding to a thyristor turnoff command by turning on the controllable switch;

detecting when the switch is conducting gate current of relatively high magnitude; and indicating the coexistence of high gate current and the thyristor turnoff command.

10. The method of claim 9 comprising the additional steps of:

preventing any turn off of the controllable switch during a predetermined interval of time following the start of the thyristor turnoff command, and turning off the switch if high gate current is detected at the end of the interval.

11. The method of claim 9, wherein the detecting step comprises:

comparing the magnitude of voltage across the controllable switch with a predetermined magnitude that is attained whenever the magnitude of gate current being conducted by the switch equals a threshold magnitude that is less than the peak magnitude needed to turn off the thyristor but greater than the magnitude conducted after the thyristor is successfully turned off.

12. A system for responding to a turn-off failure of a gate turnoff thyristor having an anode, a cathode, and a gate electrode, the gate electrode being operatively connected to a control voltage terminal by a controllable switch, the control voltage terminal having a negative potential relative to the thyristor's cathode potential, the system comprising:

means for normally responding to a thyristor turnoff command by turning on the controllable switch;

means, operatively connected to the responding means, for detecting when the switch is conducting gate current of relatively high magnitude; and means, operatively connected to the detection means, for indicating the coexistence of high gate current and the thyristor turnoff command.

13. The system of claim 12 further comprising:

means, operatively connected to the responding means, for preventing any turn off controllable of the switch during a predetermined interval of time following the start of the thyristor turnoff command: and means, operatively connected to the prevention means and the detection memory, for turning off the switch if high gate current is detected at the end of the interval.

14. The system of claim 12 wherein the detecting means comprises:

means for comparing the magnitude of voltage across the controllable switch with a predetermined magnitude that is attained whenever the magnitude of gate current being conducted by the switch equals a threshold magnitude that is less than the peak magnitude needed to turn of the thyristor but greater than the magnitude conducted after the thyristor is successfully turned off.

* * * * *